(12) United States Patent
Beaudin et al.

(10) Patent No.: US 6,472,959 B1
(45) Date of Patent: Oct. 29, 2002

(54) LONGITUDINALLY COUPLED DOUBLE MODE RESONATOR FILTERS USING SHALLOW BULK ACOUSTIC WAVES

(75) Inventors: Steve A. Beaudin, Ottawa; Simon Damphousse, Nepean; Thomas P. Cameron, Stittsville, all of (CA)

(73) Assignee: Nortel Networks Limited, St. Laurent (CA)

( * ) Notice: Subject to any disclaimer, the term of this patent is extended or adjusted under 35 U.S.C. 154(b) by 0 days.

(21) Appl. No.: 09/520,469

(22) Filed: Mar. 7, 2000

Related U.S. Application Data

(63) Continuation-in-part of application No. 09/266,026, filed on Mar. 11, 1999, now abandoned.

(51) Int. Cl.⁷ .............................. H03H 9/64; H03H 9/52
(52) U.S. Cl. .................... 333/193; 333/195; 310/313 B; 310/313 D
(58) Field of Search ................................ 333/187–189, 333/193–196; 310/313 R, 313 B, 313 C, 313 D

(56) References Cited

U.S. PATENT DOCUMENTS

| | | | |
|---|---|---|---|
| 4,295,108 A | 10/1981 | Ieki | 333/193 |
| 4,577,168 A | 3/1986 | Hartmann | 333/170 |

(List continued on next page.)

FOREIGN PATENT DOCUMENTS

| | | | | |
|---|---|---|---|---|
| EP | 0734121 | 9/1996 | | |
| JP | 63-102411 | 5/1988 | | 333/193 |
| JP | 2-130010 | 5/1990 | | 333/193 |
| JP | 3-222512 | 10/1991 | | |
| JP | 04-40705 | 2/1992 | | |
| JP | 4-113711 | 4/1992 | | 333/193 |
| JP | 4-207615 | * 7/1992 | | 333/195 |
| JP | 4-230108 | 8/1992 | | 333/193 |
| JP | 4-249907 | 9/1992 | | 333/193 |
| JP | 5-55855 | 3/1993 | | 333/193 |
| JP | 5-136651 | * 6/1993 | | 333/193 |
| JP | 5-251988 | * 9/1993 | | 333/195 |
| JP | 9-172342 | 6/1997 | | |
| JP | 9-172350 | 6/1997 | | |

OTHER PUBLICATIONS

"Wideband Low Loss Double Mode Saw Filters", T. Morita et al., IEEE 1992 Ultrasonics Symposium, pp 95–104, Oct. 20–23, 1992.

"Development of Low–Loss Band–Pass Filters Using Saw Resonators for Portable Telephones", O. Ikata et al., IEEE 1992 Ultrasonics Symposium, pp 111–115, Oct. 20–23, 1992.

"Surface Acoustic Wave Devices and Their Signal Processing Applications", Colin Campbell, Academic Press, Inc. Harcourt Brace Jovanovich, Publishers, 1989, pp 10–11; 448–455.

"Surface Acoustic Wave Devices for Mobile and Wireless Communications", C.K. Campbell, Academic Press, Inc., Harcourt Brace Jovanovich, Publishers, 1998, pp 360–373.

Primary Examiner—Robert Pascal
Assistant Examiner—Barbara Summons

(57) ABSTRACT

A filter comprises a shallow bulk acoustic wave (SBAW) longitudinally coupled double mode resonator (LCR) and a reactance coupled between an input and an output of the resonator. Due to its use of a piezoelectric substrate with high electromechanical coupling and an orientation for propagating SBAWs, the resonator has a relatively poor stop band attenuation in a shoulder region on a high frequency side of its pass band. At frequencies in the shoulder region, a signal coupled via the resonator from the input to the output is reduced by a signal of opposite phase coupled via the reactance with a similar attenuation, thereby improving attenuation in the shoulder region. The reactance can be a capacitance formed on the substrate surface.

36 Claims, 7 Drawing Sheets

U.S. PATENT DOCUMENTS

| | | | |
|---|---|---|---|
| 4,803,449 A | 2/1989 | Hikita et al. | 333/193 |
| 4,931,755 A | 6/1990 | Sakamoto et al. | 333/193 |
| 5,077,545 A | 12/1991 | Gopani et al. | 333/195 |
| 5,592,135 A | 1/1997 | Taguchi et al. | 333/193 |
| 5,694,095 A | 12/1997 | Mineyoshi | 333/193 |
| 5,790,000 A | 8/1998 | Dai et al. | 333/193 |
| 5,821,834 A | 10/1998 | Xu et al. | 333/193 |
| 5,835,990 A * | 11/1998 | Saw et al. | 310/313 D |
| 5,874,869 A * | 2/1999 | Ueda et al. | 333/193 |
| 5,936,486 A | 8/1999 | Tanaka | 333/193 |

* cited by examiner

FIG. 18
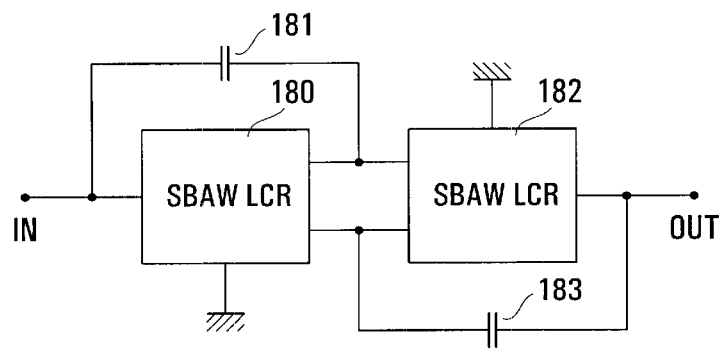
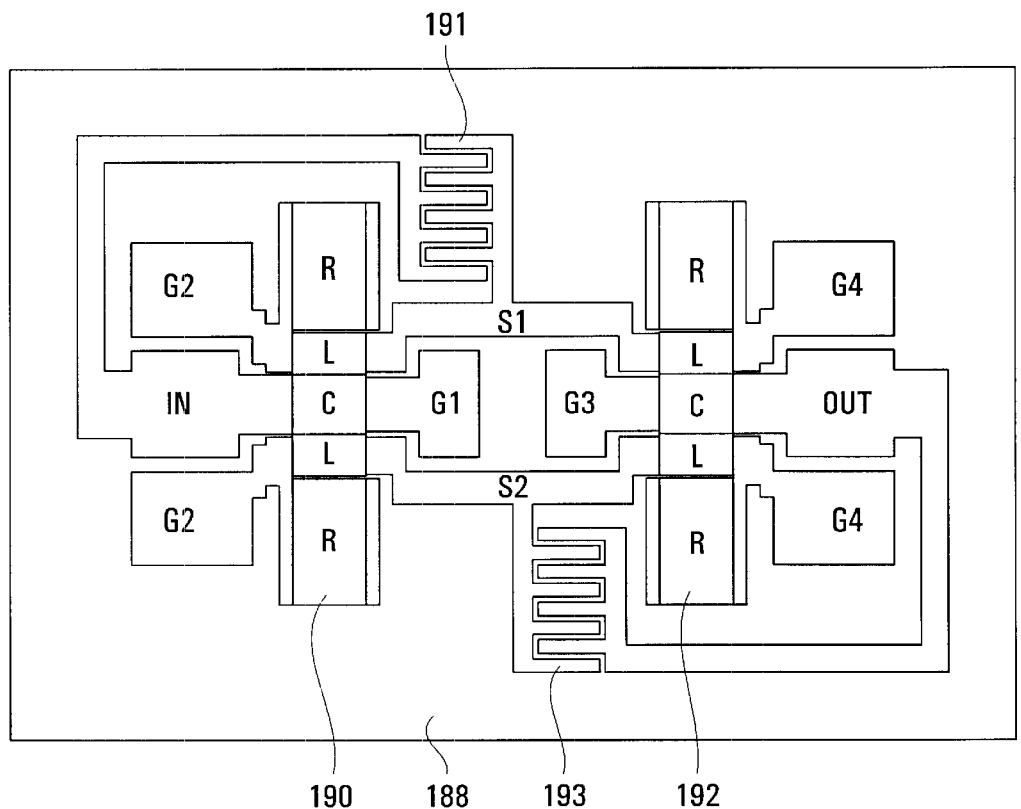
FIG. 19

LONGITUDINALLY COUPLED DOUBLE MODE RESONATOR FILTERS USING SHALLOW BULK ACOUSTIC WAVES

This is a continuation-in-part of U.S. patent application Ser. No. 09/266,026, now abandoned, filed Mar. 11, 1999 in the names of Steve A. Beaudin et al. and entitled "Longitudinally Coupled Double Mode Surface Wave Resonator Filters", the entire disclosure of which is hereby incorporated herein by reference.

This invention relates to longitudinally coupled (also called in-line coupled) double mode resonator (LCR) filters, and is particularly concerned with such filters using shallow bulk acoustic waves (SBAWs), commonly referred to as leaky SAWs (surface acoustic waves) or LSAWs.

SBAWs comprise longitudinal bulk waves with shear horizontal polarization, and include surface skimming bulk waves (SSBWs) and surface transverse waves (STWs). SBAWs or LSAWs are distinct from ordinary, Rayleigh, surface acoustic waves (SAWs), which exhibit an elliptical displacement at the surface of the substrate on which they are propagated, with components parallel to and normal to this surface. However, terms such as "surface wave", "surface acoustic wave", and "SAW" are used generally in the art to refer to both Rayleigh waves and SBAWs, and this general use is followed in this specification where convenient. Where in this specification it is necessary or desirable to refer to Rayleigh waves distinct from other types of SAWs such as SBAWs, they are referred to as "Rayleigh wave SAWs" for clarity.

BACKGROUND OF THE INVENTION

It is well known to use SAW resonators for bandpass filtering in communications equipment, especially cellular radio equipment, to provide desirable characteristics such as low insertion loss (attenuation within the filter pass band), low ripple in the pass band, high stop band rejection (attenuation outside the pass band), small size, and low cost. Known SAW resonator filters include one-pole resonators, ladder circuit structure (LS) filters comprising a plurality of one-pole resonators, waveguide coupled double mode resonator (WCR) filters, and longitudinally coupled double mode resonator (LCR) filters. It is also known in such filters to provide a capacitance arrangement in order to provide the filter with sharper band edges, i.e. steeper transitions between the pass and stop bands of the filter.

For example, Hikita et al. U.S. Pat. No. 4,803,449 issued Feb. 7, 1989 and entitled "Filter Combining Surface Acoustic Wave Resonators" discloses a filter comprising a plurality of one-pole SAW resonators coupled together via capacitance elements. Mineyoshi U.S. Pat. No. 5,694,095 issued Dec. 2, 1997 and entitled "Surface Acoustic Wave Resonance Device Adapted To Simple And Precise Adjustment Of Resonant Frequency" describes frequency adjustment of a single mode SAW resonator by providing an additional capacitance which may be in parallel with the resonator. Examples of LS filters are described in a paper by Ikata et al. entitled "Development Of Low-Loss Band-Pass Filters Using SAW Resonators For Portable Telephones", Proceedings of the IEEE Ultrasonics Symposium, 1992, pages 111 to 115.

Double mode SAW resonators include WCR (also referred to as a transversely coupled resonator) and LCR (also referred to as an in-line coupled resonator) arrangements. For example, Xu et al. U.S. Pat. No. 5,821,834 issued Oct. 13, 1998 and entitled "Surface Wave Device With Capacitance" discloses a filter having two WCRs connected in cascade with one or more shunt capacitances to narrow the filter pass band. Other WCR filters with capacitance arrangements are disclosed for example by Gopani et al. U.S. Pat. No. 5,077,545 issued Dec. 31, 1991 and entitled "Surface Acoustic Wave Waveguide-Coupled Resonator Notch Filter", and by Japanese Documents No. 4-230108 dated Aug. 19, 1992, No. 4-249907 dated Sep. 4, 1992, and No. 5-55855 dated Mar. 5, 1993, each in the name of Morii and each entitled "Surface Acoustic Wave Filter".

In addition, Japanese Document No. 3-222512 dated Oct. 1, 1991, in the name of Komazaki et al. and entitled "Polarized Type SAW Resonator Filter", discloses a plurality of one-pole resonators arranged transversely, or side by side, with a capacitance in parallel with the plural resonators to provide a steepened cut-off characteristic of the filter. WCR filters have a small fractional bandwidth (ratio of pass band width to center frequency of the pass band of the filter) suitable for example for IF (intermediate frequency) filtering in cellular communications systems. For filtering RF (radio frequency) signals in a cellular communications system, a much greater fractional bandwidth is typically required, for which it is known to use either LS filters as discussed above or LCR filters.

As is well known in the art, an LCR comprises two or more IDTs (interdigital transducers) arranged longitudinally, i.e. in line in the direction of SAW propagation, typically between two reflection gratings. LCR filters with capacitance arrangements are also known. For example, Nagaoka Japanese Document No. 2-130010 dated Nov. 10, 1988 and entitled "Surface Acoustic Wave Device" discloses an LCR filter in which a capacitance, which may be constituted by parts of the IDTs, is arranged in parallel with an LCR to provide attenuation poles above and below the pass band of the filter, thereby providing steeper transitions between the pass and stop bands.

Similarly, Japanese Document No. 9-172342 dated Jun. 30, 1997, in the name of Honmo et al. and entitled "Dual Mode Surface Acoustic Wave Resonator Filter", discloses a filter having cascaded LCRs each with a parallel capacitance, connected between the input and output of the LCR, providing attenuation poles just above and just below the filter pass band, thereby steepening the transitions between the filter pass and stop bands. As shown clearly in FIG. 4 of Honmo et al., as the magnitude of the capacitance is increased, the attenuation poles are moved more closely to the center frequency of the filter pass band, the transitions between the filter pass and stop bands become more steep, and attenuation in the stop bands becomes substantially more degraded.

In addition, Sakamoto et al. U.S. Pat. No. 4,931,755 issued Jun. 5, 1990 and entitled "Surface-Acoustic-Wave Device With A Capacitance Coupled Between Input And Output" discloses a SAW filter with multiple (e.g. five) IDTs coupled in line with one another, serving alternately as input and output IDTs, and a parallel capacitance connected between the input and output. The capacitance shifts an antiresonant frequency of the SAW device, on a high frequency side of the pass band, to a lower frequency closer to the center frequency of the pass band, thereby increasing close-in attenuation on the high frequency side of the pass band of the device. As shown in FIG. 3 of this reference, attenuation in the lower stop band, and far-out attenuation in the upper stop band, are substantially degraded.

Also, Shindo et al. Japanese Document No. 9-172350 dated Jun. 30, 1997 and entitled "Multiple-Mode Surface Acoustic Wave Filter" discloses a filter comprising two LCRs connected in cascade, with a capacitance divider at an output of the second LCR having its tapping point connected to a junction between the cascaded LCRs, to feed back part of the output signal and thereby provide a steeper attenuation characteristic of the filter. This is an IF filter for which only a small fractional bandwidth is required.

It is well known, for example from Sakamoto et al., Mineyoshi, and Xu et al. referred to above, that capacitances can be conveniently provided in a SAW device by capacitance between conductors on the substrate of the SAW device, for example in the form of an interdigital structure (IDS) on the substrate.

For filtering RF signals in current cellular communications systems, a fractional bandwidth of the order of 2 to 4% is typically required. The LCR filters of the prior art discussed above use the first (symmetric) and second (asymmetric) modes as the two modes of the LCR, and use piezoelectric substrates and orientations (crystal cuts and acoustic wave propagation directions) which do not provide filters with such a large fractional bandwidth. For example, the Honmo et al. reference discloses achieving a fractional bandwidth of about 0.3 to 0.5% using a substrate of 45° X-Z (i.e. 45° rotated X-cut Z-propagation) lithium tetraborate (LBO).

In contrast, for filtering RF signals with a large fractional bandwidth, it is desirable to use an LCR filter having a piezoelectric substrate and orientation that provides a high electromechanical coupling coefficient and a high SAW propagation velocity.

In order to address these desires, an article by Morita et al. entitled "Wideband Low Loss Double Mode SAW Filters", Proceedings of the IEEE Ultrasonics Symposium, 1992, pages 95 to 104 discloses using LCR filters using the first (symmetric) and third (symmetric) modes with a substrate of 36° Y-X lithium tantalate ($LiTaO_3$) or 64° Y-X lithium niobate ($LiNbO_3$) providing high electromechanical coupling. This is a leaky SAW arrangement in which the acoustic waves are shallow bulk acoustic waves (SBAWs), specifically surface skimming bulk waves (SSBWs), and not Rayleigh wave SAWs. More particularly, there is no significant propagation of Rayleigh waves with these substrates. Conversely, in the other prior art discussed above the substrates are selected to minimize the propagation of bulk acoustic waves, including SBAWs, because these would detract from the performance of the filters using Rayleigh wave SAWs.

Distinctions between Rayleigh wave SAWs and SBAWs are known in the art and are discussed, for example, in "Surface Acoustic Wave Devices And Their Signal Processing Applications" by Colin Campbell, Academic Press, Inc., 1989. As explained therein (pages 11, 449–455), Rayleigh wave SAWs exhibit an elliptical displacement at the surface of the substrate, with components parallel to and normal to the surface. In contrast, SBAW devices propagate longitudinal bulk waves with shear horizontal (SH) polarization. The SH waves are excited and detected by the electric field parallel to surface-deposited IDTs in a similar manner (except that they are not excited by the electric field normal to the IDT fingers) to Rayleigh wave SAWs. In consequence, SBAW and Rayleigh wave SAW devices are generally indistinguishable visually; however, the devices are physically different because they have different substrate orientations propagating different types of acoustic waves. As further explained in this reference, bulk waves have higher velocities so that SBAW devices can be designed for operation at higher frequencies than Rayleigh wave SAW devices with similar geometry. SBAW devices can be grouped into two general categories, those with no energy trapping in which the SBAWs are referred to as SSBWs, and those with an energy trapping grating structure between input and output IDTs, in which the SBAWs are referred to as surface transverse waves (STWs).

As described in the article by Morita et al., the LCR comprises a center IDT and two lateral IDTs which are arranged symetrically and positioned longitudinally between two reflection gratings, so that the first and third longitudinal resonant modes, having a greater frequency separation than the first and second modes, are excited to provide an increased bandwidth of the LCR. As also described by Morita et al., this frequency separation of the first and third mode resonant frequencies is dependent upon a center-to-center finger spacing L of adjacent fingers of the center and lateral IDTs of the LCR. A spacing $L=\lambda/2$ corresponds to a periodical positioning of the fingers throughout the center and lateral IDTs, but this can be increased or decreased. Morita et al. disclose that a maximum separation of the first and third mode resonant frequencies occurs when $L=\lambda/4$ and again, with a phase shift through 180°, when $L=3\lambda/4$, and maxima continue to occur with increasing spacings in steps of $\lambda/2$, i.e. with $L=n\lambda/2-\lambda/4$, with the acoustic coupling being weakened and the bandwidth reducing as the integer n is increased. Thus Morita et al. recognize that the greatest bandwidth is provided with n=1 and $L=\lambda/4$, for which there is no space between the adjacent fingers of the center and lateral IDTs (assuming a finger width of $\lambda/4$) so that these must be grounded fingers.

Morita et al. also disclose characteristics of the resulting LCR filter, which as is well known in the art has a raised shoulder, providing a relatively poor attenuation, in the upper stop band on the high frequency side of and adjacent to the pass band. Typically, this raised shoulder may extend over a frequency band of up to about 75% of the bandwidth of the LCR filter, providing an attenuation of only about 12 dB compared with attenuations of the order of 20 dB or more in the lower stop band and in other parts of the upper stop band.

It should be appreciated that this raised shoulder is accepted in the art as an inherent but undesired characteristic of LCR filters of the type disclosed by Morita et al., and does not appear in and is not disclosed by the other prior art discussed above, because that prior art is concerned with different types of SAW filters, specifically Rayleigh wave SAW devices, rather than leaky SAW devices on substrates with high electromechanical coupling, propagating SBAWs generally and SSBWs specifically.

Illustrating this, Murai European Patent Application No. 0734121 published Sep. 25, 1996 and entitled "Surface Acoustic Wave (SAW) Filter" discloses in its FIGS. 1–3 prior art consistent with that of the Morita et al. article discussed above, and acknowledges the raised shoulder on the high frequency side of the pass band of the LCR, illustrating this at A in its FIG. 3. This reference describes various LCR arrangements using the first and fifth (symmetric) resonant modes with a 36° Y-X lithium tantalate substrate (propagating SSBWs which are simply referred to as SAWs in the reference), with variation of a center-to-center spacing L of adjacent fingers of the input and output IDTs within a range from $5\lambda/8$ to $5\lambda/4$, and with and without series and/or shunt resonators to provide additional stop band attenuation at specific frequencies. In all of these cases, however, the raised shoulder on the high frequency side of the pass band of the LCR remains present and can be seen in the respective attenuation-frequency characteristics of the LCRs.

As evident from some of the prior art discussed above, it is also well known, in order to provide a sufficient attenuation in the stop bands, to connect together in cascade two or more 2-pole filters to provide a 4-pole, 6-pole, or higher-order filter, even though this results in increased insertion loss and complexity. Although such filters in a cascade are typically of the same type, this need not necessarily be the case. For example, as discussed above, Murai discloses additional resonators connected in series or shunt at the input and/or output of an LCR.

In addition, Taguchi et al. U.S. Pat. No. 5,592,135 issued Jan. 7, 1997 and entitled "Surface Acoustic Wave Filter With Different Filter Portions Satisfying Complex Conjugate Relationship Of Impedances" discloses a cascade of an LCR filter with one or more LS filter sections constituted by series and shunt SAW resonators (also using a 36° Y-X lithium tantalate substrate, propagating SSBWs which are again simply referred to as SAWs in the reference). Taguchi et al. illustrate typical characteristics of the cascaded sections in FIGS. 1 and 3, the latter illustrating the raised shoulder on the high frequency side of the pass band, this being compensated by the relatively good attenuation of the LS filter in this region. Conversely, the relatively poor far-out attenuation of the LS filter is compensated by the good attenuation of the LCR in these parts of the stop bands. Thus Taguchi et al. also illustrate the acceptance in the art of the raised shoulder on the high frequency side of the pass band in an LCR filter of the type disclosed by Morita et al.

Distinctions between Rayleigh wave SAWs and SBAWs or leaky SAWs, and LCR filters using the latter, are further known from "Surface Acoustic Wave Devices For Mobile And Wireless Communications" by Colin Campbell, Academic Press, Inc., 1998, especially Sections 13.2 to 13.4 on pages 360 to 373. FIGS. 13.3(a) and (b) on page 365 illustrate IDT structures for LSAW (leaky-SAW) LCR filters for operation in the first and second modes and in the first and third modes as discussed above. The same page states: "The two port structure of FIG. 13.3(a) looks deceptively like the two-port Rayleigh-wave resonators considered in Chapter 11, but its operation is significantly different."

With reference to FIG. 13.5 on page 367, illustrating the frequency response of a two-pole LSAW LCR with a 1 dB fractional bandwidth of about 3.6% and showing the raised shoulder on the high frequency side of the pass band as discussed above, this reference states on page 366: "The relatively poor cut-off response in the upper stopband is characteristic of this LSAW filter type, and may be attributed to high-frequency remnants of the distorted LSAW radiation conductance in FIG. 13.2." FIG. 13.2 on page 364 of the reference compares the radiation conductance and susceptance of transducers on substrates with standard Rayleigh wave SAWs and LSAWs, showing that the strong coupling of LSAW devices causes the radiation conductance to be distorted on the high frequency side, resulting in the raised shoulder. This is not the case for resonators using Rayleigh wave SAWs.

Japanese Documents No. 4-40705 dated Feb. 12, 1992 and No. 4-113711 dated Apr. 15, 1992, each in the name of Tada and each entitled "Longitudinal Dual Mode Surface Acoustic Wave Filter", disclose two cascaded sections of energy confined resonators, on substrates of 36° Y-X lithium tantalate and 41° Y-X lithium niobate respectively, with a shunt capacitance connected between a junction of the cascaded resonators and ground to provide a filter with reduced spurious outputs in the pass band. These references are not concerned with improving attenuation in the stop bands of the filter.

An object of this invention is to provide an LCR using SBAWs and a piezoelectric substrate having relatively high electromechanical coupling, for example an LCR such as disclosed by Morita et al. as discussed above, in which the raised shoulder in the upper stop band attenuation-frequency characteristic, on the high frequency side of the pass band, is reduced or eliminated. As discussed above, none of the prior art addresses this problem, and instead the prior art simply accepts this raised shoulder as being inherent in the characteristic of such LCRs.

SUMMARY OF THE INVENTION

According to one aspect of this invention there is provided a filter having an input and an output, the filter comprising: a longitudinally coupled double mode resonator (LCR) comprising a plurality of interdigital transducers (IDTs), coupled between the input and the output, longitudinally coupled with one another on a surface of a piezoelectric substrate with an orientation for transducing and propagating shallow bulk acoustic waves (SBAWs), the LCR having a pass band and upper and lower stop bands and having a relatively poor attenuation in a raised shoulder region in the upper stop band on a high frequency side of the pass band; and a reactance coupled between the input and the output, the reactance being selected to couple a signal from the input to the output with a phase change generally opposite to a phase change of a signal coupled from the input to the output via the LCR at frequencies of said raised shoulder region, and with an attenuation such that the filter comprising the LCR and the reactance has a greater attenuation than the LCR at frequencies of said raised shoulder region.

Viewed alternatively, the invention provides a filter comprising a shallow bulk acoustic wave (SBAW) longitudinally coupled double mode resonator (LCR) and a reactance coupled between an input and an output of the resonator, the reactance and the resonator being arranged to couple a signal from the input to the output with generally opposite phases at frequencies in a shoulder region in an upper stop band on a high frequency side of a pass band of the resonator where the resonator has a relatively poor stop band attenuation, the reactance having a magnitude such that in said region attenuation of the filter comprising the resonator and the reactance is greater than attenuation of the resonator.

For use as an RF filter, preferably the resonator has a fractional bandwidth of about 2% to about 4%. To facilitate this, preferably the resonator comprises a center IDT between two lateral IDTs, with adjacent fingers of the center IDT and each lateral IDT having a center-to-center spacing of about $\lambda/4$, where $\lambda$ is the wavelength of the propagated SBAWs at a center frequency of the pass band of the resonator. In this case the reactance preferably comprises a capacitance between conductors on the surface of the substrate, for example constituted by an interdigital structure on the surface of the substrate, typically with a magnitude of the order of 0.15 pF or less. The substrate is preferably selected from the group comprising, approximately, 36° to 42° Y-X lithium tantalate and 41°, 49°, and 64° Y-X lithium niobate, providing high electro-mechanical coupling and a suitable orientation for transducing and propagating SBAWs rather than Rayleigh wave SAWS.

The invention also provides a filter comprising a plurality of filter sections connected in cascade, wherein at least one of the filter sections comprises a filter as recited above. One such filter can include two filter sections each comprising a filter as recited above, connected in cascade by connections of each of the two lateral IDTs of one filter section to a respective one of the two lateral IDTs of the other of the two filter sections, wherein there is no direct electrical connection between the two lateral IDTs of each filter section, and wherein the reactances of the two filter sections are connected to respective ones of said connections between the lateral IDTs of the filter sections so that the reactances do not provide an electrical path between an input and an output of the filter connected to the central IDTs of the two filter sections.

Another aspect of the invention provides a method of improving a relatively poor stop band attenuation in a shoulder region in an upper stop band on a high frequency side of a pass band of a longitudinally coupled double mode surface wave resonator comprising at least two interdigital transducers on a surface of a piezoelectric substrate with an orientation for transducing and propagating shallow bulk acoustic waves, comprising providing a reactance between an input and an output of the resonator, the reactance coupling a signal from the input to the output with a phase change that is generally opposite to a phase change of a signal at frequencies in said shoulder region coupled from the input to the output via the resonator, and with an attenuation such that in said shoulder region attenuation of the combination of the resonator and the reactance is greater than attenuation of the resonator.

A further aspect of the invention provides a filter comprising: a first longitudinally coupled double mode resonator (LCR) and a second LCR each comprising a center interdigital transducer (IDT) and two lateral IDTs longitudinally coupled with one another on a surface of a piezoelectric substrate for coupling acoustic waves between said IDTs; an input and an output of the filter connected to the center IDT of respectively the first and second LCRS; a first signal connection between a first one of the two lateral IDTs of the first LCR and a first one of the two lateral IDTs of the second LCR; a second signal connection between a second one of the two lateral IDTs of the first LCR and a second one of the two lateral IDTs of the second LCR, the second signal connection not being directly electrically connected to the first signal connection; a first reactance connected between the input of the filter and the first signal connection; and a second reactance connected between the output of the filter and the second signal connection.

Preferably each reactance comprises a capacitance constituted by an interdigital structure on the surface of the substrate, and preferably the substrate has an orientation for transducing and propagating shallow bulk acoustic waves (SBAWs), each LCR has a pass band and upper and lower stop bands and has a relatively poor attenuation in a shoulder region in the upper stop band on a high frequency side of the pass band, and each reactance is selected to increase attenuation in said shoulder region.

BRIEF DESCRIPTION OF THE DRAWINGS

The invention will be further understood from the following description by way of example with reference to the accompanying drawings, in which:

FIG. 18 schematically illustrates a 4-pole LCR filter in accordance with another embodiment of this invention; and FIG. 19 schematically illustrates a physical layout of the filter of FIG. 18.

DETAILED DESCRIPTION

Figure 1:
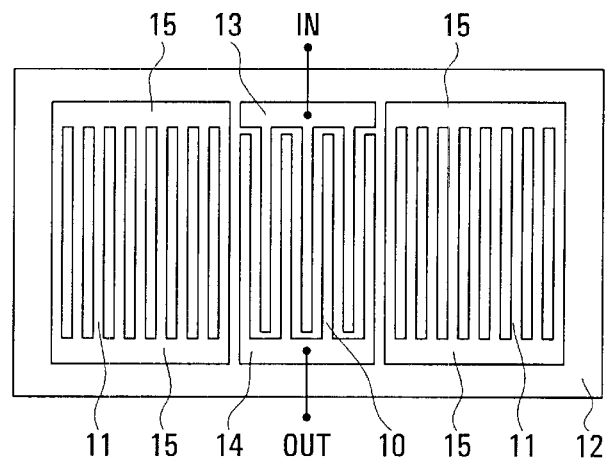
FIG. 1 schematically illustrates a known single mode surface wave resonator.

Referring to the drawings, FIG. 1 illustrates a known single mode surface acoustic wave (SAW) resonator, which comprises an interdigital transducer (IDT) 10 between two reflection gratings, or reflectors, 11 on a surface of a piezoelectric substrate 12 such as lithium niobate or lithium tantalate. An input IN and an output OUT are connected to opposite conductive rails 13 and 14 respectively of the IDT 10. Conductive rails 15 of the reflectors 11 can be grounded or electrically floating, and the reflectors can alternatively be formed for example by grooves in the substrate 12. The conductors of the IDT 11 and the reflectors 12 as shown in FIG. 1 are represented diagrammatically and not to scale, and their sizes, spacings, materials, etc. are selected as is known in the art to provide desired characteristics, e.g. center frequency, bandwidth, insertion loss, etc., of the SAW device, and similar comments apply to all of the drawings and throughout this specification.

As discussed above, Mineyoshi U.S. Pat. No. 5,694,095 describes frequency adjustment of a single mode SAW resonator of the form of FIG. 1 by providing an additional capacitance, which can be constituted by an interdigital structure (IDS) on the surface of the piezoelectric substrate. In one described embodiment this additional capacitance is connected in parallel with the single mode resonator, i.e. between the input and the output of the resonator, resulting in a resonator having an electrical equivalent circuit as shown in FIG. 2.

Figure 2:
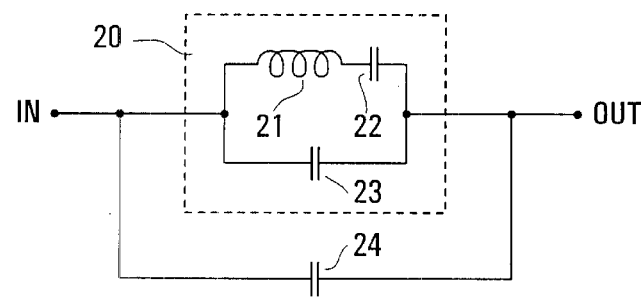
FIG. 2 illustrates an equivalent circuit of a single mode surface wave resonator with a capacitor connected in parallel with it in a known manner.

Referring to FIG. 2, the equivalent circuit of the single mode resonator itself is shown within a dashed line box and comprises a series circuit consisting of an inductance 21 and a capacitance 22, in parallel with a capacitance 23 corresponding to an electrostatic capacitance of the resonator. The IDS capacitance 24 in this case appears directly in parallel with the capacitance 23. As described in the Mineyoshi patent, the series inductance 21 and the series capacitance 22 determine the single resonant frequency of the resonator, and an antiresonant frequency of the resonator is determined by the inductance 21 and the capacitances 22, 23, and 24, so that it can be adjusted by adjustment of the additional capacitance 24.

Figure 3:
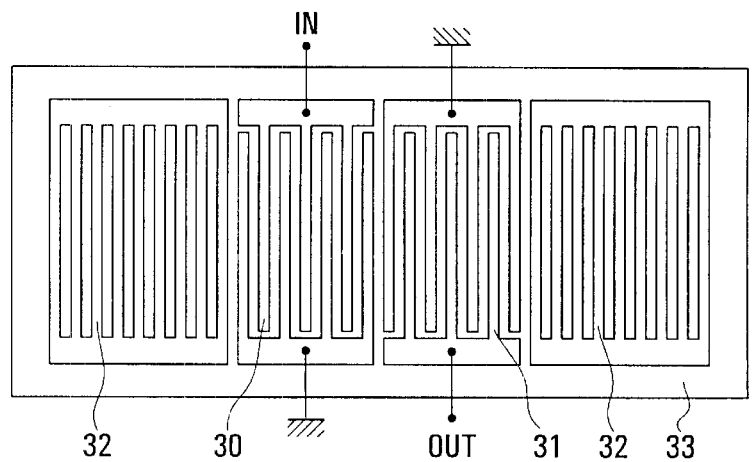
FIG. 3 schematically illustrates a known LCR filter.

FIG. 3 illustrates a known LCR (longitudinally coupled double mode resonator) filter, comprising two IDTs 30 and 31 coupled in line with one another (in the direction of surface wave propagation, i.e. longitudinally coupled) between two reflectors 32 on a surface of a piezoelectric substrate 33. The IDT 30 is connected between the input IN and ground, and the IDT 31 is connected between the output OUT and ground. In this double mode resonator the first longitudinal (symmetric) and second longitudinal (asymmetric) modes are excited, providing two resonant frequencies.

Figure 4:
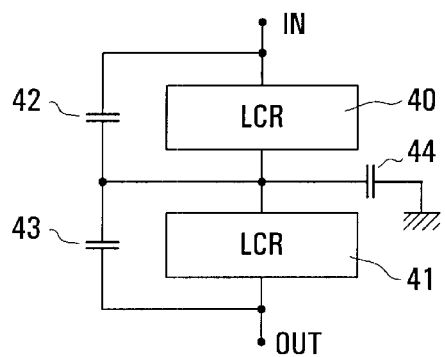
FIG. 4 schematically illustrates a known filter comprising two of the LCR filters of FIG. 3 in cascade, with parallel capacitances.

For the specific case in which the piezoelectric substrate 33 has a crystal orientation and SAW propagation direction for transducing and propagating Rayleigh wave SAWs, FIG. 4 schematically illustrates a filter comprising two cascaded LCRs 40 and 41, each as described above with reference to FIG. 3, and capacitances 42, 43, and 44 as disclosed by Honmo et al. Japanese Document No. 9-172342 referred to above. The capacitances 42 and 43 are connected in parallel with, i.e. between the input and the output of, the LCRs 40 and 41 respectively, and the capacitance 44 is connected between a junction, of the capacitances 42 and 43 with the cascaded LCRs, and ground. As disclosed by Honmo et al., the LCRs 40 and 41 use a 45° X-Z substrate of LBO (lithium tetraborate) and provide a filter with a fractional bandwidth of 0.22%. The capacitance 44 has a magnitude of 0.8 pF, and the capacitances 42 and 43 conveniently have equal magnitude Cb. Honmo et al. also illustrate characteristics of the filter for various values of Cb from 0 to 0.4 pF.

Figure 5:
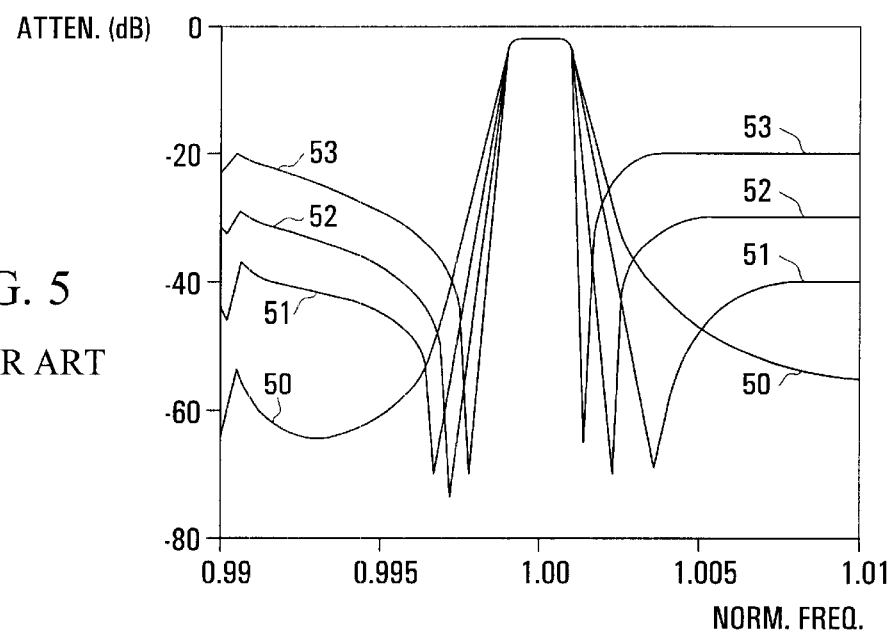
FIG. 5 illustrates known attenuation-frequency characteristics of the filter of FIG. 4 for various parallel capacitance magnitudes.

FIG. 5 represents these filter characteristics by lines 50 to 53 for values of Cb=0, 0.1, 0.2, and 0.4 pF respectively. In FIG. 5, the vertical direction represents filter attenuation and the horizontal direction represents normalized frequency, from which it can be seen that the filter has a small fractional bandwidth. As illustrated by the line 50, without the capacitances 42 and 43 (i.e. with Cb=0) the filter has relatively gradual transitions between the pass and stop bands. As described by Honmo et al., the capacitances 42 and 43 serve to introduce attenuation poles above and below the filter pass band, these attenuation poles or notches serving directly to steepen the transitions between the filter pass and stop bands. As shown by the lines 51 to 53, the notch frequencies are moved more closely to the filter band edges, and the transitions between the filter pass and stop bands become more steep, as the capacitance magnitude Cb is increased. At the same time, however, the attenuation in both of the stop bands becomes substantially more degraded as the capacitance magnitude Cb is increased.

In the filter of Honmo et al. and as shown in FIG. 5, there is no raised shoulder on the high frequency side of the pass band as discussed above with reference to Morita et al., because the LCRs use a substrate which propagates Rayleigh wave SAWs rather than SBAWs. Consequently, the problem which the present invention addresses is not recognized or addressed by Honmo et al. In addition, it is observed that the capacitances 42 and 43 introduce distinct attenuation poles, i.e. sharp notches in the filter characteristic, at specific antiresonance frequencies just above and just below the filter pass band, in order directly to steepen the filter band edges.

An LCR filter having the same visual appearance as that of FIG. 3 can, as disclosed in the article by Morita et al. referred to above, be formed as a leaky SAW on a substrate of, for example, 36° Y-X lithium tantalate. Such a substrate propagates SBAWs (SSBWs) rather than Rayleigh wave SAWs, and the filter has the consequent characteristic with the raised shoulder on the high frequency side of the pass band as discussed above and further described below. While the principles of the present invention can also be applied to such an LCR filter using the first and second resonant modes, it is described further below in its application to an LCR filter using the first and third modes because these modes have a greater frequency separation thereby providing a greater pass band width as is desirable for RF filters. Likewise, the principles of the invention may be applied to other LCR filters propagating SBAWs, for example an LCR filter using the first and fifth (symmetric) resonant modes with a 36° Y-X lithium tantalate substrate as disclosed by Murai European Patent Application No. 0734121 referred to above.

Figure 6:
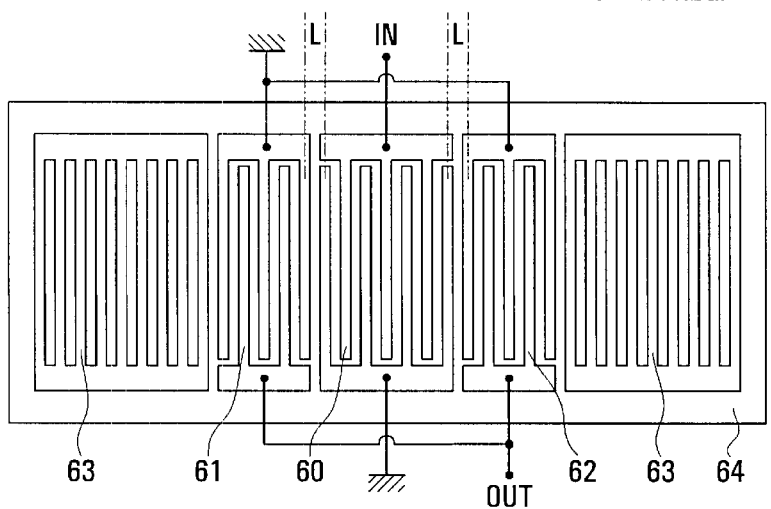
FIG. 6 schematically illustrates another known LCR filter.

FIG. 6 illustrates a leaky SAW LCR filter as disclosed by Morita et al. using the first (symmetric) and third (symmetric) modes with a substrate of 36° Y-X lithium tantalate ($LiTaO_3$) or 64° Y-X lithium niobate ($LiNbO_3$) providing high electromechanical coupling. As discussed above, in such a filter the acoustic waves are shallow bulk acoustic waves (SBAWs), specifically surface skimming bulk waves (SSBWs), and not Rayleigh waves, and there is no significant propagation of Rayleigh wave SAWs in the filter. The LCR filter of FIG. 6 comprises three IDTs 60, 61, and 62 coupled in line with one another (i.e. longitudinally coupled) between two reflectors 63 on the surface of the substrate 64. The central IDT 60 is connected between the input IN and ground. The IDTs 61 and 62, referred to as lateral IDTs and being similar to one another, are connected in parallel with one another between the output OUT and ground.

Figure 7:
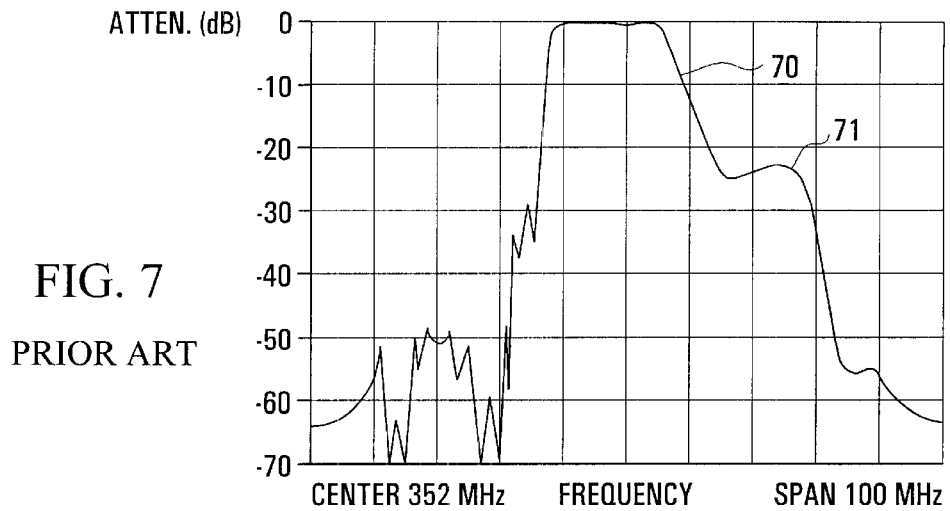
FIG. 7 illustrates a known attenuation-frequency characteristic of a 4-pole filter comprising two of the LCR filters of FIG. 6 in cascade.

Typically, two LCR filters each as described above with reference to FIG. 6 are connected together in cascade to provide a two-stage 4-pole filter which has an attenuation characteristic (i.e. attenuation as a function of frequency) of the form illustrated in FIG. 7. In FIG. 7, a line 70 indicates approximately the attenuation in decibels (dB) of a 4-pole cascaded LCR filter as described above using SBAWs, relative to a 0 dB level at a pass band center frequency of 352 MHz as illustrated, over a frequency span of 100 MHz. It can be appreciated from FIG. 7 that such a filter has a relatively large fractional bandwidth as illustrated. An insertion loss (i.e. loss from input to output represented as 0 dB in FIG. 7) of such a two-stage filter is typically of the order of 2.5 dB.

As discussed above, the frequency characteristic represented by the line 70 has a raised shoulder 71 on the high frequency side of the pass band, providing relatively poor attenuation, of the order of 25 dB for a two-stage 4-pole LCR filter as illustrated, in this part of the stop band of the filter. Elsewhere in the stop bands, as shown by the line 70, such a filter provides relatively good attenuation. This raised shoulder is understood to be due to the distorted radiation conductance of leaky SAW or SBAW devices using piezoelectric substrates with high electromechanical coupling to transduce and propagate the SBAWs, and accordingly is not present in devices propagating Rayleigh wave SAWs, as disclosed for example by Honmo et al. referred to above. As discussed above, the existence of this raised shoulder has, prior to the present invention, been accepted in the art as an inherent disadvantage of this type of LCR filter. For example, in Taguchi et al. U.S. Pat. No. 5,592,135 referred to above such a 2-pole LCR filter is connected in cascade with one or more LS filter sections to compensate for the raised shoulder of the LCR filter.

Referring again to FIG. 6, a center-to-center finger spacing L of adjacent fingers of the center IDT 60 and each lateral IDT 61 and 62 is also illustrated. As illustrated in FIG. 6, this spacing L is equal to $\lambda/2$, where $\lambda$ is the wavelength of the propagated SBAWs at the center frequency of the pass band, and corresponds to a periodical positioning of the fingers throughout the center and lateral IDTs. As disclosed by Morita et al., decreasing or increasing this spacing L increases a separation of the first and third mode resonant frequencies, and hence increases the bandwidth of the LCR filter, with a maximum occurring when L=$\lambda/4$ and again, with a phase shift through 180°, when L=$3\lambda/4$; maxima continue to occur with increasing spacings in steps of $\lambda/2$, i.e. with L=$n\lambda/2-\lambda/4$ where n is an integer greater than zero, with the acoustic coupling being weakened and the bandwidth reducing as n is increased.

Figure 8:
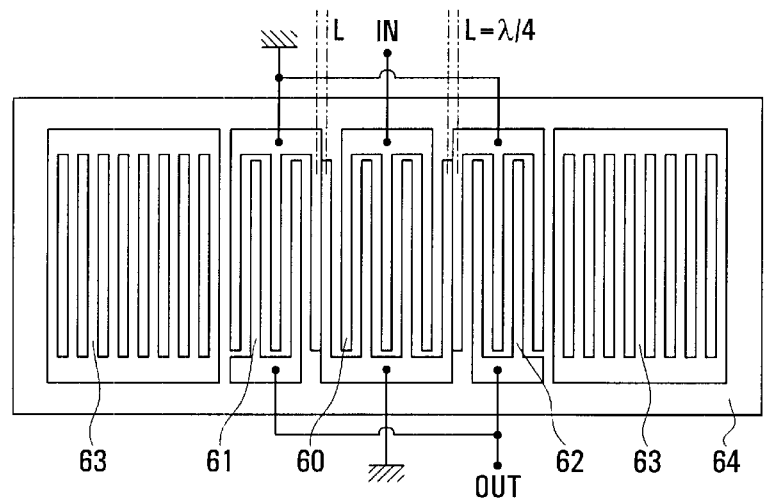
FIGS. 8 and 9 schematically illustrate known modifications of the LCR filter of FIG. 6.
Figure 9:
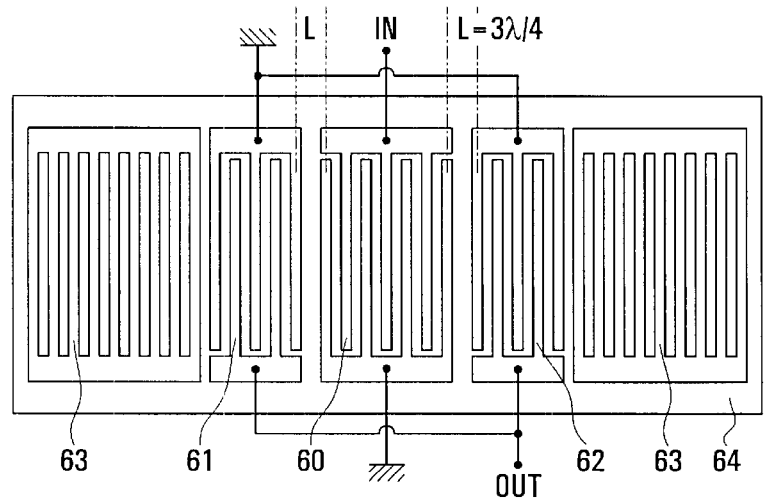

FIGS. 8 and 9 illustrate the LCR filter of FIG. 6 with L=$\lambda/4$ (n=1) and L=$3\lambda/4$ (n=2) respectively. Although Morita et al. recognize that the greatest bandwidth is provided with n=1 and L=$\lambda/4$, as illustrated by FIG. 7 of the Morita et al. article the bandwidth for n=2 and L=$3\lambda/4$ is very nearly the same so that this is a practical alternative. In the case of n=1 and L=$\lambda/4$, as shown in FIG. 8, with usual finger widths of $\lambda/4$ there is no gap between the edges of adjacent fingers of the center and lateral IDTs, so that these must be grounded fingers. This restriction does not apply to the case of n=2 and L=$3\lambda/4$ shown in FIG. 9, for which the signal and ground connections of the input and/or output IDTs can be reversed from those illustrated in FIG. 9.

Figure 10:
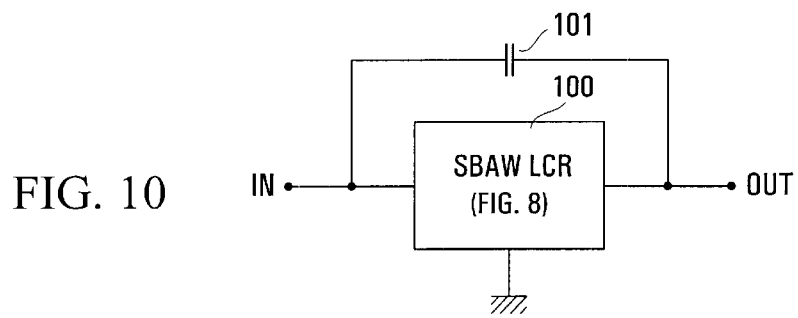
FIG. 10 schematically illustrates a 2-pole LCR filter in accordance with an embodiment of this invention.

FIG. 10 illustrates a 2-pole LCR filter in accordance with an embodiment of this invention. This comprises a SBAW or leaky SAW LCR filter 100 having substantially the same form as that of FIG. 8, with a parallel capacitance 101 connected between the input and the output of the LCR filter. As in FIG. 8, the center-to-center finger spacing L (not shown in FIG. 10) of adjacent fingers of the center IDT and each lateral IDT is equal to $\lambda/4$, and each finger has a width of $\lambda/4$ so that there is no gap between these adjacent fingers, which are connected to ground as illustrated in FIG. 8. The piezoelectric substrate of the SBAW LCR 100 of FIG. 10 provides high electromechanical coupling and propagates SBAWs rather than Rayleigh wave SAWs as discussed above. For example, this substrate can be 36° Y-X lithium tantalate, 64° Y-X lithium niobate, or 41° Y-X lithium niobate.

Depending upon various factors such as the metalization thickness and the desired electromechanical coupling and filter bandwidth, other substrates and orientations may be used. In particular, the substrate can comprise Y-X lithium tantalate with a cut in a range from about 36° to about 42°, higher angles typically being provided for thicker metalization, and a 49° Y-X lithium niobate substrate may alternatively be used.

Figure 11:
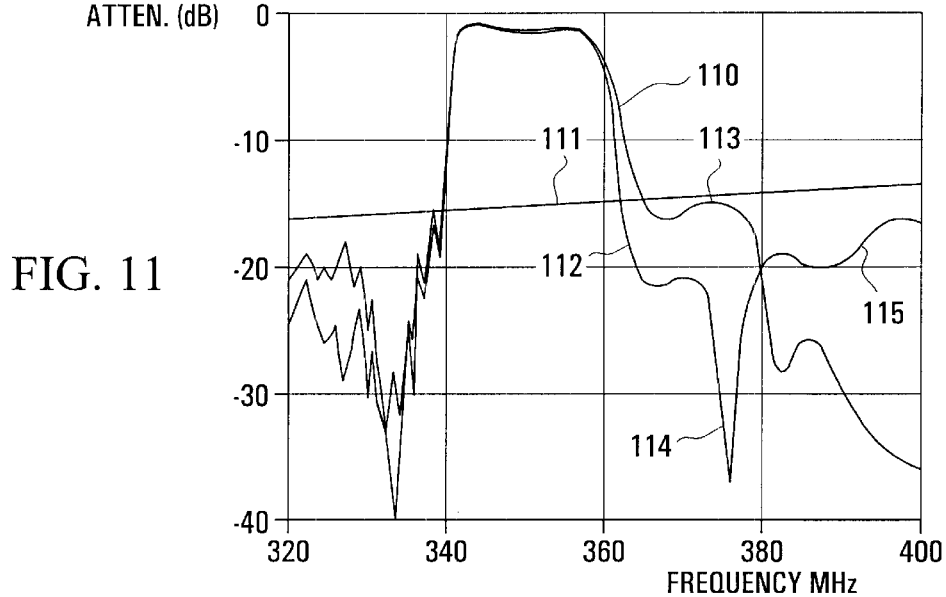
FIGS. 11 and 12 illustrate attenuation-frequency and phase-frequency characteristics, respectively, relating to the LCR filter of FIG. 10.
Figure 12:
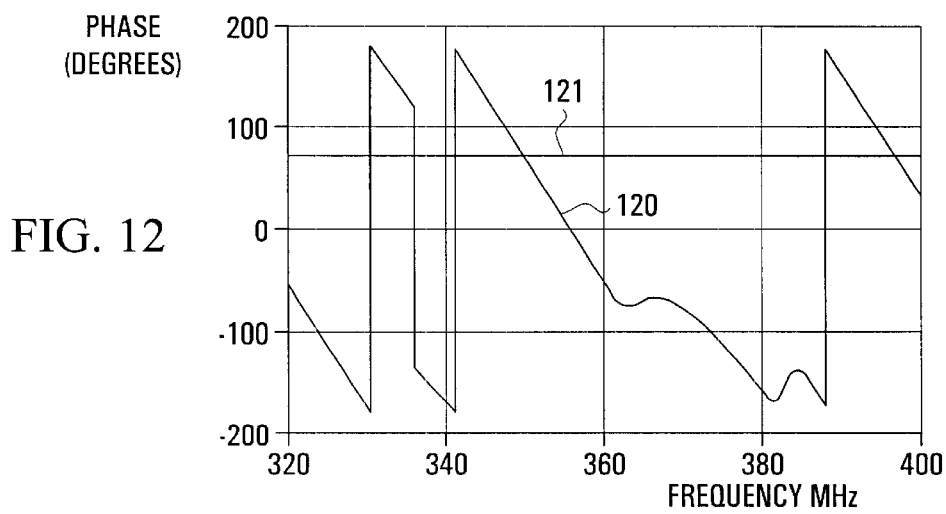

The operation of the 2-pole LCR filter of FIG. 10 is explained below with reference to FIGS. 11 and 12. FIG. 11 illustrates by lines 110, 111, and 112 the general form of attenuation-frequency characteristics of respectively the LCR filter 100, the capacitance 101, and their combination in the filter of FIG. 10. FIG. 12 illustrates by lines 120 and 121 a general form of phase-frequency characteristics of respectively the LCR filter 100 and the capacitance 101.

As shown in FIG. 11 by the line 110, the LCR filter 100 has the raised shoulder 113 on the high frequency side of the pass band, as discussed above and as is typical of an LCR filter using SBAWs. As also shown in FIG. 11 by the line 111, the capacitance 101 provides an approximately constant attenuation over the pass band and close-in parts of the stop bands of the filter, and its magnitude is selected so that this attenuation is about the same as that of the raised shoulder 113.

As shown in FIG. 12 by the line 120, the LCR filter 100 provides a phase change, for a signal coupled from the input IN to the output OUT, of about 180° at the third mode resonant frequency near the low-frequency end of the pass band of the filter, and a phase change of about 0° at the first mode resonant frequency near the high-frequency end of the pass band of the filter. The line 120 shows that, at frequencies corresponding to the position of the raised shoulder 113 in the attenuation-frequency characteristic of FIG. 11, the LCR filter 100 provides a phase change which is relatively constant, being of the order of −70° to −100° in this region. As shown by the line 121 in FIG. 12, the capacitance 101 provides a substantially constant phase change of about +80° over the entire frequency range illustrated.

Because in the raised shoulder region 113 of the attenuation-frequency characteristic 110 of the LCR filter 100 the capacitance 101 provides an approximately similar attenuation but an opposite phase response to the LCR filter 100, it substantially enhances the attenuation of the combined LCR filter and capacitance in this region, as illustrated in FIG. 11 by the line 112. As illustrated in FIG. 11, the magnitude of the capacitance selected in this case also introduces a notch 114 at an antiresonance frequency above the pass band of the filter, but unlike the prior art discussed above this notch 114 is relatively spaced from the upper band edge of the filter and the notch 114 does not directly steepen the upper band edge as in the prior art. The presence of the capacitance 101 also detracts from the stop band attenuation of the filter of FIG. 10 at frequencies well above the pass band, as shown at 115 in FIG. 11.

Thus in contrast to the prior art discussed above, in which a parallel capacitance is used to directly steepen band edges of a filter which does not use SBAWs and in which there is no raised shoulder on the high frequency side of the pass band, the invention applies to an LCR filter using SBAWs which has such a raised shoulder, and compensates for the raised shoulder by adding a parallel capacitance providing a generally comparable attenuation and generally opposite phase to that in the raised shoulder region. As described further below, the added capacitance need not necessarily introduce a notch on the high-frequency side of the pass band, and any notch that it does introduce is relatively spaced from the band edge (as shown by the notch 114 in FIG. 11) and does not directly steepen the upper band edge of the filter. Although in FIG. 11 the upper band edge is steepened as shown by the line 112, this is primarily due to the improved attenuation in the raised shoulder region, and not due directly to the introduction of a steep notch immediately above the pass band as in the prior art as shown by the lines 51 to 53 in FIG. 5.

Referring again to FIGS. 6, 8, and 9, it will be recalled from the above description that the spacing L=$3\lambda/4$ in the LCR filter of FIG. 9 provides almost the same fractional bandwidth as that of FIGS. 8 and 10. However, as mentioned above, in the LCR filter of FIG. 9 there is a phase change of 180° compared to the filter of FIG. 8, so that its phase-frequency characteristic is relatively inverted from that of the LCR filter 100 of FIG. 10 and shown by the line 120 in FIG. 12. Consequently, adding the parallel capacitance 101 to such an LCR filter would substantially worsen the attenuation-frequency characteristic of the filter in the raised shoulder region. Instead, a parallel inductance can be provided to improve the raised shoulder region in this case, but in practice it is far more difficult and inconvenient to provide such an inductance, compared to providing a capacitance which, as known in the art, can easily be constituted by an IDS on the piezoelectric substrate.

More generally, it can be appreciated that for the spacing $L=n\lambda/2-\lambda/4$ the parallel capacitance 101 can be provided to improve the raised shoulder region when n is odd, and a parallel inductance can instead be provided to improve the raised shoulder region when n is even. However, in view of the relative ease of providing a parallel capacitance, the typical desire for large fractional bandwidth, and decreasing fractional bandwidth with increasing values of n, it is preferred that n=1, $L=\lambda/4$, and the parallel capacitance 101 be provided as illustrated in FIGS. 8 and 10.

It is observed that the above comments apply for providing a maximum fractional bandwidth, with values of L which are conveniently integer multiples of $\lambda/4$. However, the principles of the invention, of compensating for the raised shoulder region in the attenuation-frequency characteristic of an LCR filter using SBAWs by providing a parallel capacitance or, more generally, reactance providing an approximately similar attenuation of opposite phase in this region, are also applicable to other values of the spacing L. Likewise, although this specific description relates to LCR filters using the first and third resonant modes, it is also applicable in a corresponding manner to LCR filters using other resonant modes, such as the first and second or first and fifth resonant modes as described above.

Figure 13:
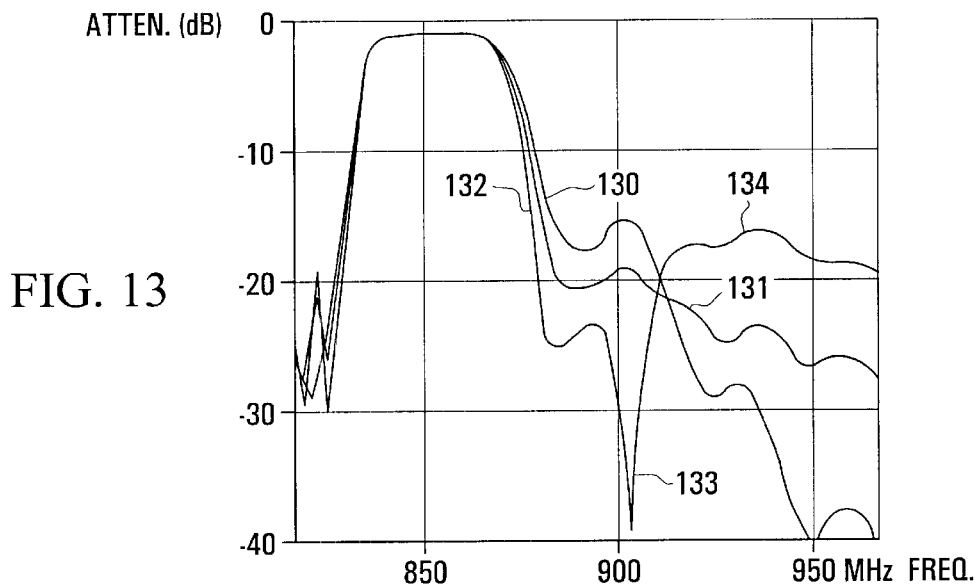
FIG. 13 illustrates attenuation-frequency characteristics of the LCR filter of FIG. 10 for different magnitudes of capacitance.

FIG. 13 illustrates attenuation characteristics for another 2-pole LCR 100 using SBAWs with a parallel capacitance 101 as illustrated in FIG. 10, for different magnitudes of the capacitance 101 and in comparison to no capacitance being present. As illustrated in FIG. 13, a line 130 represents the attenuation of the LCR filter with no capacitance, displaying the raised shoulder and generally having the same form as the line 110 in FIG. 11 as is typical of an LCR using SBAWs. A line 132 represents the attenuation of the LCR filter with a capacitance of 0.15 pF, generally having the same form as the line 112 in FIG. 11, with a notch 133 in the high frequency stop band and a somewhat degraded attenuation 134 at higher frequencies. A line 131 represents the attenuation of the LCR filter with a capacitance of 0.075 pF; it can be clearly seen that with this smaller capacitance the raised shoulder is still attenuated to a significant extent, but there is no significant notch on the high frequency side of the pass band and the attenuation at higher frequencies is not degraded to an undesirable extent.

It can therefore be seen that the magnitude of the parallel capacitance 101 can be selected to provide a desired improvement of the shoulder region attenuation consistent with the far-out attenuation that is required. As a package used for the LCR filter or, typically, two or more cascaded LCR filters may have a rejection of the order of 60 dB, the LCR filters and parallel capacitances themselves need not provide a greater far-out attenuation; for example they can provide an attenuation of 30 dB per filter for two filters in cascade, or 20 dB per filter for three filters in cascade.

As can be seen from the above examples, the magnitude of the capacitance 101 is relatively small, typically about 0.15 pF or less. Signal delays due to connection lead lengths are also a significant factor with increasing frequencies, so that it is highly desirable, or necessary, to provide the capacitance 101 in close proximity to the LCR filter 100. As indicated above, it is particularly convenient to provide the capacitance 101 on the same piezoelectric substrate as the LCR filter 100, for example as an interdigital structure (IDS) as described below. However, other forms of capacitance may instead be provided on the same substrate, and the capacitance 101 may alternatively be provided in any other convenient and practical manner.

Figure 14:
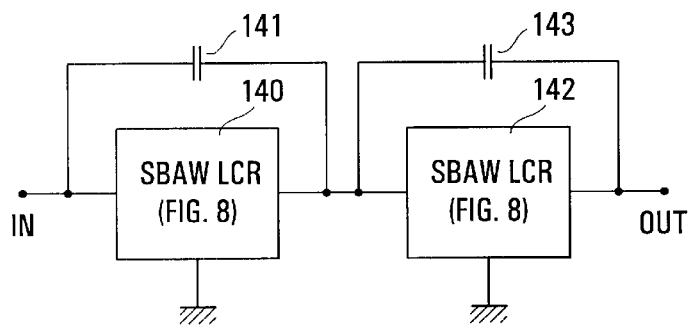
FIG. 14 schematically illustrates a 4-pole LCR filter in accordance with an embodiment of this invention.

As in the prior art, it may be desirable to provide a plurality of cascaded 2-pole SBAW LCR filter sections in order to provide a desired filter characteristic, in which case each LCR filter section can be provided with a respective capacitance connected between the input and the output of the respective filter section. FIG. 14 illustrates a cascade of two such 2-pole LCR filter sections 140 and 142 connected between an input IN and an output OUT, with a capacitance 141 connected between the input and output of the LCR filter section 140, and a capacitance 143 connected between the input and the output of the LCR filter section 142. It can be appreciated that advantages of the invention may still be provided if one of the capacitances 141 or 143 is omitted from the circuit of FIG. 14, and that this may be advantageous for providing desired attenuation in the filter stop band at frequencies other than those of the raised shoulder region.

Figure 15:
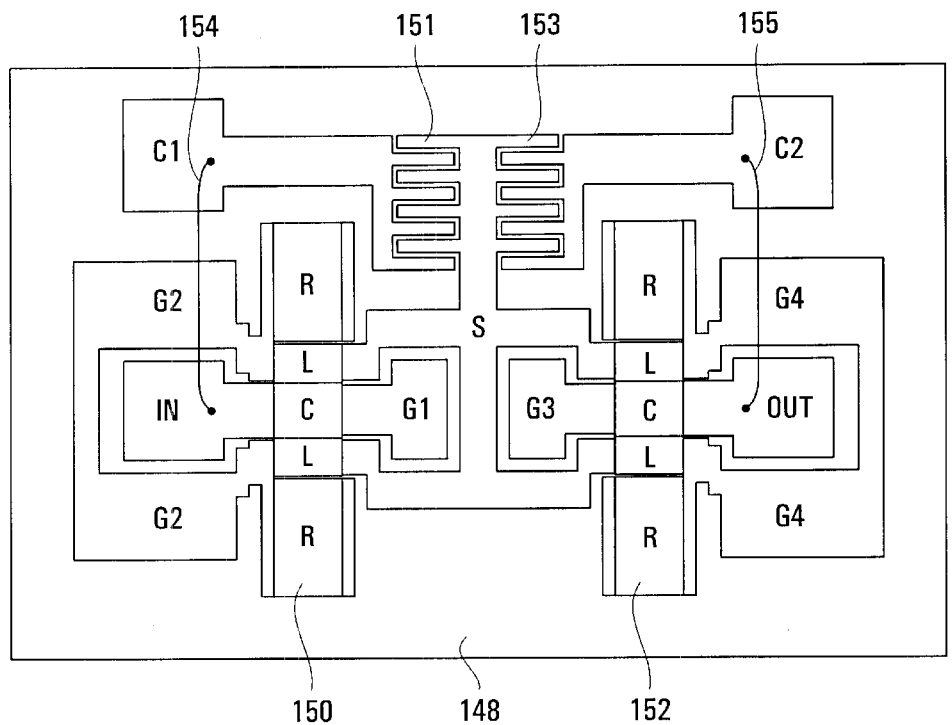
FIG. 15 schematically illustrates a physical layout of the filter of FIG. 14.

FIG. 15 schematically illustrates a physical layout of the 4-pole cascaded filter of FIG. 14, 148 representing the piezoelectric substrate of for example 64° Y-X lithium niobate for propagating SBAWs. A 2-pole LCR filter 150, having the form described above with reference to FIG. 10, corresponding to the filter section 140 of FIG. 14, has a central IDT C connected between an input connection pad IN and a ground connection pad G1, two lateral IDTs L connected between signal conductors S, corresponding to a junction between the filter sections 140 and 142 in FIG. 14, and ground connection pads G2, and reflection gratings R also connected to the ground connection pads G2. Another 2-pole LCR filter 152, also having the form described above with reference to FIG. 10 and corresponding to the filter section 142 of FIG. 14, has a central IDT C connected between an output connection pad OUT and a ground connection pad G3, two lateral IDTs L connected between the conductors S and ground connection pads G4, and reflection gratings R connected to the ground connection pads G4. An IDS 151, connected between a connection pad C1 and the signal conductors S, corresponds to the capacitor 141 of FIG. 14 and is connected between the input and output of the LCR 150 by a wire bond 154 between the connection pads C1 and IN. Another IDS 153, connected between a connection pad C2 and the signal conductors S, corresponds to the capacitor 143 of FIG. 14 and is connected between the input and output of the LCR 152 by a wire bond 155 between the connection pads C2 and OUT.

It can be appreciated that the position and design of each IDS is arranged to avoid any undesired interference of any acoustic waves generated thereby with the desired acoustic waves of the filter sections 150 and 152. To this end, any of various techniques for example as discussed in Xu et al. U.S. Pat. No. 5,821,834, referred to above, can be used. For example, each IDS 151 and 153 can have finger widths which are substantially different from those of the filter sections 150 and 152 so that any acoustic waves produced are in a very different frequency range, and as shown in FIG. 15 each IDS is laterally offset from each filter section so that any acoustic waves produced by the IDSs have substantially no effect on the filter sections. The wire bonds 154 and 155 can in alternative arrangements be replaced by conductors on the substrate 148.

One-such 4-pole filter has been designed for the 824 to 849 MHz cellular communications band, using a substrate of 64° Y-X lithium niobate and Ti/Al metalization with a thickness of 2100 Angstrom units. Each LCR comprised a center IDT of 39 finger pairs, lateral IDTs of 25 finger pairs each, 100 strips per reflection grating, an aperture of 120 μm, a line width of 1.3 μm, and a ratio of 1.02 between the periodicity of the reflection gratings and the IDTs. A capacitance of 0.075 pF was connected in parallel with each LCR. This filter provided an insertion loss of about 2.5 dB, a 2 dB bandwidth of 34 MHz (a 2 dB fractional bandwidth of about 4%), and an attenuation of about 42 dB in a region on the high frequency side of the pass band where typically the raised shoulder would appear with an attenuation of the order of 25 dB. The ultimate rejection was about 60 dB, approaching the limit for the package used, demonstrating that the improved attenuation in the raised shoulder region was not at the expense of far-out attenuation of the filter. Other filters employing the principles of the invention have shown similar advantageous performance.

Although FIGS. 14 and 15 illustrate a capacitance connected between the input and output of each 2-pole LCR filter section, it can be appreciated that in a cascade of filter sections advantages of this invention may be provided by a capacitance connected between the input and output of each of only one or some, and not all, of the filter sections.

Figure 16:
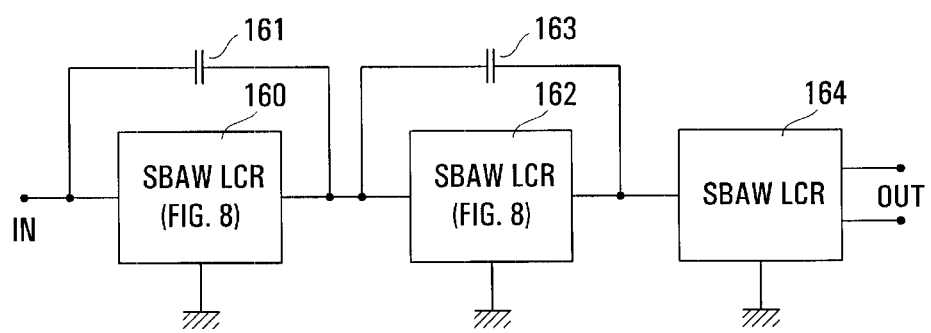
FIG. 16, which is on the same sheet as FIGS. 13 and 14.

For example, FIG. 16 illustrates a 6-pole LCR filter comprising three 2-pole LCR filter sections 160, 162, and 164 connected in cascade. A capacitance 161 is connected between the input and the output of the LCR filter section 160, and a capacitance 163 is connected between the input and output of the LCR filter section 162. Accordingly, these two stages can be as described above with reference to FIGS. 14 and 15, providing the advantage of increased attenuation in the raised shoulder region as described above. The two LCR filter sections 160 and 162 and/or the two capacitances 161 and 163 can be the same or different from one another, to provide desired filter characteristics. The LCR filter section 164 has no capacitance, and can be a known LCR filter section as described above, providing the advantage of good attenuation in the stop bands, so that the 6-pole cascaded LCR filter as a whole has a desirable frequency characteristic.

As illustrated in FIG. 16, however, the LCR filter section 164 also provides a balun function between its input and a balanced or differential output, so that the cascaded filter as a whole also provides a balun function between a single-ended or unbalanced input IN connected to the input of the filter section 160 and the balanced outputs of the filter section 164 connected to a balanced output OUT. The balun function of the 2-pole LCR filter section 164 can be provided for example as described in Dai et al. U.S. Pat. No. 5,790, 000 issued Aug. 4, 1998 and entitled "Cascaded Surface Wave Device Filters Providing Balanced And Unbalanced Signal Connections". As is well known in the art, the two wires of the balanced or differential output of the LCR filter section 164 have opposite phases. It can be appreciated that in the filter of FIG. 16, as in the other filters described herein, the filter input and output may be interchanged.

Figure 17:
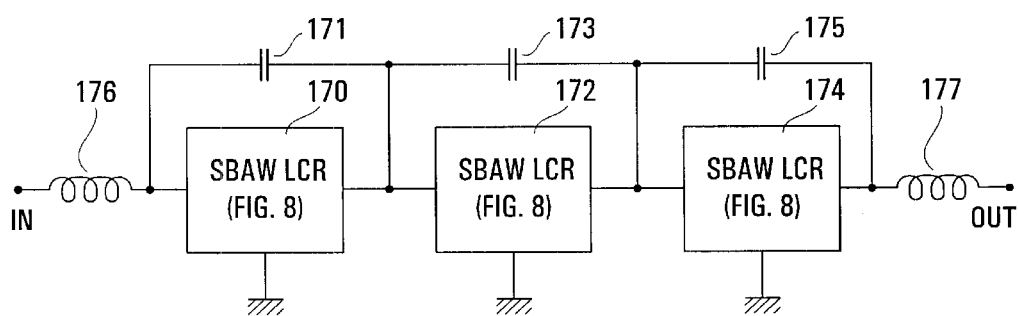
FIG. 17 schematically illustrate 6-pole LCR filters in accordance with embodiments of this invention.

In order to reduce possible adverse effects of the parallel capacitance on the stop band attenuation of the associated LCR filter, the magnitude of the capacitance can be reduced with a reduction in the aperture of the filter section. In this case matching inductances may be required for coupling at the input and output of the filter. In this respect, FIG. 17 illustrates another 6-pole LCR filter comprising three 2-pole LCR filter sections 170, 172, and 174 connected in cascade, each with a capacitance 171, 173, and 175 respectively connected between the input and output of the LCR filter section as described above. The LCR filter sections 170, 172, and 174 can each have an aperture that is only about 17 wavelengths of the SBAW at the center frequency of the filter, this being typically about half to one third the aperture of LCR filter sections without matching inductances. The capacitances 171, 173, and 175 can have correspondingly reduced magnitudes, so that they also require a reduced area to implement as IDSs. The same size of substrate that is normally required for a two stage, 4-pole LCR filter can then for example accommodate all of the elements 170 to 175 of the three stage 6-pole filter of FIG. 17. As shown in FIG. 17, the input IN of the cascaded filter is coupled to the input of the first LCR filter section 170 via a matching inductance 176, and the output of the third LCR filter section 174 is coupled to the output OUT of the cascaded filter via a matching inductance 177. The matching inductances 176 and 177 may for example each be of the order of 22 nH.

FIG. 18 illustrates a 4-pole LCR filter in accordance with another embodiment of this invention, arranged to reduce adverse effects of the parallel capacitances by avoiding a direct electrical path between the input and the output via these parallel capacitances. As shown in FIG. 18, a cascade of two 2-pole SBAW LCR filter sections 180 and 182 is connected between an input IN and an output OUT. Each of the SBAW LCR filter sections 180 and 182 has substantially the same form as in the SBAW LCR filters described above, for example being as described above with reference to FIG. 8, except that there is no connection between the signal or non-grounded conductors of the lateral IDTs. As a result of the symmetry of each of the LCR filter sections 180 and 182 (they do not provide a balun function as does the LCR filter section 164 in FIG. 16), these conductors carry substantially the same signal as one another and can be connected together or not as a matter of choice. Thus in the 4-pole filter of FIG. 18, the input IN and the output OUT are coupled to the central IDTs of the LCR filter sections 180 and 182 respectively, and the two lateral IDTs of the LCR filter section 180 are coupled to the two lateral IDTs of the LCR filter section 182 respectively, but there is no electrical interconnection between the two lateral IDTs of each LCR filter section. As further illustrated in FIG. 18, a parallel capacitance 181 is connected between the central IDT input and only one of the two lateral IDT outputs of the LCR filter section 180 (and hence only one of the two lateral IDT inputs of the LCR filter section 182), and a parallel capacitance 183 is connected between only the other of the two lateral IDT outputs of the LCR filter section 180 (and hence only the other of the two lateral IDT inputs of the LCR filter section 182) and the central IDT output of the LCR filter section 182.

As indicated above and as clearly illustrated in FIG. 18, this interconnection of the SBAW LCR filter sections 180 and 182 and the capacitances 181 and 183 avoids a direct electrical path between the input IN and the output OUT, which is otherwise provided via the parallel capacitances for example as can be seen from FIG. 14. Consequently, the 4-pole SBAW LCR filter of FIG. 18 can potentially provide better attenuation in the stop bands than the filter of FIG. 14. It can be appreciated that the principles of FIG. 18 can also be applied to cascaded LCR filter sections other than those using SBAWs, and can also be incorporated into other filters using a cascade of filter sections, such as the 6-pole filters of FIGS. 16 and 17.

FIG. 19 schematically illustrates a physical layout of the 4-pole cascaded filter of FIG. 18, 188 representing the piezoelectric substrate of for example 64° Y-X lithium niobate for propagating SBAWs. A 2-pole LCR filter 190, corresponding to the filter section 180 of FIG. 18, has a central IDT C connected between an input connection pad IN and a ground connection pad G1, two lateral IDTs L connected between ground connection pads G2 and respective signal conductors S1 and S2, and reflection gratings R also connected to the ground connection pads G2. Another 2-pole LCR filter 192, corresponding to the filter section 182 of FIG. 18, has a central IDT C connected between an output connection pad OUT and a ground connection pad G3, two lateral IDTs L connected between the respective conductors S1 and S2 and ground connection pads G4, and reflection gratings R also connected to the ground connection pads G4. An IDS 191 is connected between the input connection pad IN and the signal conductor S1, and corresponds to the capacitor 181 of FIG. 18. Another IDS 193, connected between the signal conductor S2 and the output connection pad OUT, corresponds to the capacitor 183 of FIG. 18. The signal connectors S1 and S2, unlike the signal conductor S in FIG. 15, are not interconnected, so that there is no direct electrical path from the input connection pad IN to the output connection pad OUT via the IDS capacitances 191 and 193.

Although the embodiments of the invention described above with reference to FIGS. 14 to 19 refer to parallel capacitances for increasing attenuation in the raised shoulder region of the filter attenuation characteristic, it should be appreciated that, as discussed above, with an opposite signal phase in this raised shoulder region an inductance may be provided instead of a capacitance for the same purpose. In a cascade of two or more 2-pole SBAW LCR filter sections, it is also conceivable to use different types of reactance for different ones of the filter sections.

It can be appreciated that 2-pole LCR filter sections as described above using the principles of this invention can be used individually or in other cascade arrangements, optionally with other types of filter such as LS filters, to provide various desired overall filter characteristics.

Thus although particular embodiments and examples of the invention have been described above, it can be appreciated that numerous modifications, variations, and adaptations may be made without departing from the scope of the invention as defined in the claims.

What is claimed is:

1. A filter having an input and an output, the filter comprising:
   a longitudinally coupled double mode resonator (LCR) comprising a plurality of interdigital transducers (IDTs), coupled between the input and the output, longitudinally coupled with one another on a surface of a piezoelectric substrate with an orientation for transducing and propagating shallow bulk acoustic waves (SBAWs), the LCR having a pass band and upper and lower stop bands and having a relatively poor attenuation in a raised shoulder region in the upper stop band on a high frequency side of the pass band; and
   a reactance coupled between the input and the output, the reactance being selected to couple a signal from the input to the output with a phase change generally opposite to a phase change of a signal coupled from the input to the output via the LCR at frequencies of said raised shoulder region, and with an attenuation such that the filter comprising the LCR and the reactance has a greater attenuation than the LCR at frequencies of said raised shoulder region.

2. A filter as claimed in claim 1 wherein the reactance comprises a capacitance between conductors on the surface of the substrate.

3. A filter as claimed in claim 2 wherein the capacitance has a magnitude of the order of 0.15 pF or less.

4. A filter as claimed in claim 1 wherein the reactance comprises a capacitance constituted by an interdigital structure on the surface of the substrate.

5. A filter as claimed in claim 1 wherein the resonator has a fractional bandwidth of about 2% to about 4%.

6. A filter as claimed in claim 1 wherein the substrate is selected from the group comprising about 36° to about 42° Y-X lithium tantalate and about 41°, about 49°, and about 64° Y-X lithium niobate.

7. A filter as claimed in claim 1 wherein the resonator comprises a center IDT between two lateral IDTs.

8. A filter as claimed in claim 7 wherein adjacent fingers of the center IDT and each lateral IDT have a center-to-center spacing of about $\lambda/4$, where $\lambda$ is the wavelength of the propagated SBAWs at a center frequency of the pass band of the resonator.

9. A filter as claimed in claim 8 wherein the reactance comprises a capacitance on the surface of the substrate.

10. A filter as claimed in claim 9 wherein the capacitance has a magnitude of the order of 0.15 pF or less.

11. A filter as claimed in claim 9 wherein the substrate is selected from the group comprising about 36° to about 42° Y-X lithium tantalate and about 41°, about 49°, and about 64° Y-X lithium niobate.

12. A filter comprising a plurality of filter sections connected in cascade, wherein at least one of the filter sections comprises a filter as claimed in claim 11.

13. A filter comprising two filter sections each comprising a filter as claimed in claim 11, connected in cascade by connections of each of the two lateral IDTs of one filter section to a respective one of the two lateral IDTs of the other of the two filter sections, wherein there is no direct electrical connection between the two lateral IDTs of each filter section, and wherein the capacitances of the two filter sections are connected to respective ones of said connections between the lateral IDTs of the filter sections so that the capacitances do not provide an electrical path between an input and an output of the filter connected to the central IDTs of the two filter sections.

14. A filter comprising a plurality of filter sections connected in cascade, wherein at least one of the filter sections comprises a filter as claimed in claim 7.

15. A filter comprising two filter sections each comprising a filter as claimed in claim 7, connected in cascade by connections of each of the two lateral IDTs of one filter section to a respective one of the two lateral IDTs of the other of the two filter sections, wherein there is no direct electrical connection between the two lateral IDTs of each filter section, and wherein the reactances of the two filter sections are connected to respective ones of said connections between the lateral IDTs of the filter sections so that the reactances do not provide an electrical path between an input and an output of the filter connected to the central IDTs of the two filter sections.

16. A filter as claimed in claim 15 wherein each of the reactances comprises a capacitance on the surface of the substrate.

17. A filter comprising a plurality of filter sections connected in cascade, wherein at least one of the filter sections comprises a filter as claimed in claim 1.

18. A filter comprising a shallow bulk acoustic wave (SBAW) longitudinally coupled double mode resonator (LCR) and a reactance coupled between an input and an output of the resonator, the reactance and the resonator being arranged to couple a signal from the input to the output with generally opposite phases at frequencies in a shoulder region in an upper stop band on a high frequency side of a pass band of the resonator where the resonator has a relatively poor stop band attenuation, the reactance having a magnitude such that in said region attenuation of the filter comprising the resonator and the reactance is greater than attenuation of the resonator.

19. A filter as claimed in claim 18 wherein the reactance comprises a capacitance on a substrate of the resonator.

20. A filter as claimed in claim 19 wherein the capacitance has a magnitude of the order of 0.15 pF or less.

21. A filter as claimed in claim 18 wherein the resonator has a piezoelectric substrate selected from the group comprising about 36° to about 42° Y-X lithium tantalate and about 41°, about 49°, and about 64° Y-X lithium niobate.

22. A filter as claimed in claim 18 wherein the resonator has a fractional bandwidth of about 2% to about 4%.

23. A filter as claimed in claim 18 wherein the resonator comprises a center interdigital transducer (IDT) between two lateral IDTs on a surface of a piezoelectric substrate of the resonator with an orientation for transducing and propagating SBAWs.

24. A filter as claimed in claim 23 wherein the reactance comprises a capacitance on the surface of the substrate.

25. A filter as claimed in claim 24 wherein the capacitance has a magnitude of the order of 0.15 pF or less.

26. A filter as claimed in claim 24 wherein adjacent fingers of the center IDT and each lateral IDT have a center-to-center spacing of about $\lambda/4$, where $\lambda$ is the wavelength of the propagated SBAWs at a center frequency of the pass band of the resonator.

27. A filter as claimed in claim 26 wherein the substrate is selected from the group comprising about 36° to about 42° Y-X lithium tantalate and about 41°, about 49°, and about 64° Y-X lithium niobate.

28. A filter comprising two filter sections each comprising a filter as claimed in claim 23, connected in cascade by connections of each of the two lateral IDTs of one filter section to a respective one of the two lateral IDTs of the other of the two filter sections, wherein there is no direct electrical connection between the two lateral IDTs of each filter section, and wherein the reactances of the two filter sections are connected to respective ones of said connections between the lateral IDTs of the filter sections so that the reactances do not provide an electrical path between an input and an output of the filter connected to the central IDTs of the two filter sections.

29. A filter as claimed in claim 28 wherein each of the reactances comprises a capacitance on the surface of the substrate.

30. An acoustic wave device filter comprising a plurality of filter sections connected in cascade, wherein at least one of the filter sections comprises a filter as claimed in claim 18.

31. A method of improving a relatively poor stop band attenuation in a shoulder region in an upper stop band on a high frequency side of a pass band of a longitudinally coupled double mode surface wave resonator comprising at least two interdigital transducers on a surface of a piezoelectric substrate with an orientation for transducing and propagating shallow bulk acoustic waves, comprising providing a reactance between an input and an output of the resonator, the reactance coupling a signal from the input to the output with a phase change that is generally opposite to a phase change of a signal at frequencies in said shoulder region coupled from the input to the output via the resonator, and with an attenuation such that in said shoulder region attenuation of the combination of the resonator and the reactance is greater than attenuation of the resonator.

32. A method as claimed in claim 31 wherein the reactance comprises a capacitance on the surface of the substrate.

33. A method as claimed in claim 31 wherein the substrate is selected from the group comprising about 36° to about 42° Y-X lithium tantalate and about 41°, about 49°, and about 64° Y-X lithium niobate.

34. A filter comprising:
a first longitudinally coupled double mode resonator (LCR) and a second LCR each comprising a center interdigital transducer (IDT) and two lateral IDTs longitudinally coupled with one another on a surface of a piezoelectric substrate for coupling acoustic waves between said IDTs;
an input and an output of the filter connected to the center IDT of respectively the first and second LCRs;
a first signal connection between a first one of the two lateral IDTs of the first LCR and a first one of the two lateral IDTs of the second LCR;
a second signal connection between a second one of the two lateral IDTs of the first LCR and a second one of the two lateral IDTs of the second LCR, the second signal connection not being directly electrically connected to the first signal connection;
a first reactance connected between the input of the filter and the first signal connection; and
a second reactance connected between the output of the filter and the second signal connection.

35. A filter as claimed in claim 34 wherein each reactance comprises a capacitance constituted by an interdigital structure on the surface of the substrate.

36. A filter as claimed in claim 34 wherein the substrate has an orientation for transducing and propagating shallow bulk acoustic waves (SBAWs), each LCR has a pass band and upper and lower stop bands and has a relatively poor attenuation in a shoulder region in the upper stop band on a high frequency side of the pass band, and each reactance is selected to increase attenuation in said shoulder region.

* * * * *